United States Patent
Alava et al.

(10) Patent No.: US 11,145,549 B2
(45) Date of Patent: Oct. 12, 2021

(54) FIELD EFFECT TRANSISTOR WITH AN ATOMICALLY THIN CHANNEL

(71) Applicant: COMMISSARIAT A L'ENERGIE ATOMIQUE ET AUX ENERGIES ALTERNATIVES, Paris (FR)

(72) Inventors: Thomas Alava, Grenoble (FR); Thomas Ernst, Morette (FR); Zheng Han, Noyarey (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/647,265

(22) PCT Filed: Sep. 11, 2018

(86) PCT No.: PCT/FR2018/052211
§ 371 (c)(1),
(2) Date: Mar. 13, 2020

(87) PCT Pub. No.: WO2019/053362
PCT Pub. Date: Mar. 21, 2019

(65) Prior Publication Data
US 2020/0258783 A1    Aug. 13, 2020

(30) Foreign Application Priority Data
Sep. 15, 2017   (FR) ...................... 17 58588

(51) Int. Cl.
*H01L 21/8234*     (2006.01)
*G01N 27/414*      (2006.01)
(Continued)

(52) U.S. Cl.
CPC .............. *H01L 21/823431* (2013.01); *G01N 27/4146* (2013.01); *H01L 21/0256* (2013.01);
(Continued)

(58) Field of Classification Search
CPC ......... H01L 21/02527; H01L 21/02557; H01L 21/0256; H01L 21/02568;
(Continued)

(56) References Cited

U.S. PATENT DOCUMENTS 6,413,802 B1    7/2002  Hu et al.
8,216,894 B2    7/2012  Lander
(Continued)

FOREIGN PATENT DOCUMENTS

KR    10-2011-0018851 A    2/2011
WO    WO 2014/197857 A1   12/2014

OTHER PUBLICATIONS

U.S. Appl. No. 14/519,353, filed Oct. 21, 2014, US 2015/0107336 A1, Hentz, et al.
(Continued)

*Primary Examiner* — Stephen W Smoot
(74) *Attorney, Agent, or Firm* — Oblon, McClelland, Maier & Neustadt, L.L.P.

(57) ABSTRACT

Production of a transistor, the channel structure of which comprises at least one finned channel structure, the method comprising: forming, from a substrate (1), a molding block (3), forming, on the molding block, a thin layer (7) made from a given semiconductor or semi-metallic material, and consisting of one to ten atomic or molecular monolayers of two-dimensional crystal, withdrawing the molding block while retaining a portion (7a) of the thin layer extending against a lateral face of the molding block, said retained portion (7a) forming a fin that is capable of forming a channel structure of the transistor,
producing a coating gate electrode against said fin.

13 Claims, 4 Drawing Sheets

(51) Int. Cl.
  *H01L 21/02* (2006.01)
  *H01L 29/16* (2006.01)
  *H01L 29/417* (2006.01)
  *H01L 27/088* (2006.01)
  *H01L 29/66* (2006.01)
  *H01L 29/78* (2006.01)

(52) U.S. Cl.
  CPC .. *H01L 21/02527* (2013.01); *H01L 21/02557* (2013.01); *H01L 21/02568* (2013.01); *H01L 21/823418* (2013.01); *H01L 21/823425* (2013.01); *H01L 21/823437* (2013.01); *H01L 27/0886* (2013.01); *H01L 29/1606* (2013.01); *H01L 29/41791* (2013.01); *H01L 29/66795* (2013.01); *H01L 29/785* (2013.01)

(58) Field of Classification Search
  CPC ..... H01L 21/823418; H01L 21/823425; H01L 21/823431; H01L 21/823821; H01L 27/0886; H01L 27/0924; H01L 29/1037; H01L 29/1606; H01L 29/22; H01L 29/41791; H01L 29/66045; H01L 29/66795; H01L 29/66969; H01L 29/785
  See application file for complete search history.

(56) References Cited

U.S. PATENT DOCUMENTS

| | | | |
|---|---|---|---|
| 9,704,990 B1* | 7/2017 | Mochizuki | H01L 21/28255 |
| 10,090,302 B2* | 10/2018 | Anderson | H01L 21/76224 |
| 10,121,785 B2* | 11/2018 | Kanakasabapathy | |
| | | | H01L 21/823807 |
| 2007/0298599 A1* | 12/2007 | Jang | H01L 21/823412 |
| | | | 438/585 |
| 2010/0055388 A1* | 3/2010 | Chen | H01L 29/66795 |
| | | | 428/119 |
| 2013/0214332 A1 | 8/2013 | Wu | |
| 2014/0015015 A1 | 1/2014 | Krivokapic et al. | |
| 2014/0260547 A1 | 9/2014 | Balandin | |
| 2015/0050800 A1 | 2/2015 | Brand et al. | |
| 2016/0013184 A1* | 1/2016 | Alptekin | H01L 29/0653 |
| | | | 257/401 |

OTHER PUBLICATIONS

U.S. Appl. No. 15/388,673, filed Dec. 22, 2016, US 2017/0184556 A1, Toffoli et al.

U.S. Appl. No. 15/873,136, filed Jan. 17, 2018, US 2018/0202982 A1, Fain et al.

International Search Report dated Dec. 19, 2018 in PCT/FR2018/052211 filed Sep. 11, 2018, 2 Pages.

French Preliminary Search Report dated May 22, 2018 in Patent Application No. 1758588 filed Sep. 15, 2017, 1 Page.

Sujay B. Desai, et al., "MoS$_2$ transistors with 1-nanometer gate lengths," Science, vol. 354, No. 6308, Oct. 7, 2016, 5 Pages.

Chenguang Qiu, et al., "Scaling carbon nanotube complementary transistors to 5-nm gate lengths," Science, vol. 355, No. 6322, Jan. 20, 2017, 7 Pages.

Jian Sun, et al., "Room temperature detection of individual molecular physisorption using suspended bilayer graphene," Sci. Adv., e1501518, vol. 2, No. 4, Apr. 15, 2016, 8 Pages.

Digh Hisamoto, et al., "A Folded-channel MOSFET for Deep-sub—tenth Micron Era," IEEE, 1998, 3 Pages.

Min-Cheng Chen, et al., "Hybrid Si/TMD 2D Electronic Double Channels Fabricated Using Solid CVD Few-Layer-MoS$_2$ Stacking for V$_{th}$ Matching and CMOS-Compatible 3DFETs," IEDM14, 2014, 4 Pages.

Min-Cheng Chen, et al., "TMD FinFET with 4 nm Thin Body and Back Gate Control for Future Low Power Technology," IEDM15, 2015, 4 Pages.

* cited by examiner

FIELD EFFECT TRANSISTOR WITH AN ATOMICALLY THIN CHANNEL

TECHNICAL FIELD

The present invention relates to the field of transistors of the type commonly referred to as finFET wherein the channel structure is formed of at least one bar, also referred to as fin, which extends on a substrate with at least one gate electrode which may be arranged on several faces of the fin and/or have a surrounding distribution around the fin.

It relates to the use of transistors having one or more fins of very small critical dimension, in particular less than 10 nm nanometres, and may be applied particularly to the production of sensors such as biological sensors or gas sensors provided with such transistors and the sensitivity whereof is enhanced.

PRIOR ART

As a general rule, it is sought constantly to reduce the dimensions of transistors, particularly to enhance the integration density thereof.

The document "$MoS_2$ transistors with 1-nanometer gate lengths" by Sujay B. Desai et al. Science 354 (2016) 99-102, describes for example a transistor of very reduced dimensions and provided in particular with a gate length of the order of 1 nm, and which is presented in the form of a nano-tube. The channel structure is herein not in the form of a fin but a layer of $MoS_2$ arranged on the nano-tube.

At the same time as seeking to reduce the dimensions of transistors, it is also sought to enhance the electrical performances thereof.

A finFET type transistor particularly enables due to the finned structure thereof superior electrostatic channel control.

In the field of fin transistors, the document "Hybrid Si/TMD 2D Electronic Double Channels Fabricated Using Solid CVD Few Layer-$MoS_2$ stacking for Vth Matching and CMOS-compatible 3DFETs", by Chen et al. IEDM 2014, describes for example an enhanced channel structure in the form of a silicon fin covered with a thin layer of 2D semiconductor material comprising between 3 and 16 molecular monolayers of $MoS_2$.

Such a fin structure to which the thin layer 2D semiconductor material is adjoined makes it possible to obtain enhanced electrical performances particularly in terms of conduction current.

However, the dimensions of the channel structure are dependent herein essentially on those of the silicon fin, the size whereof is generally imposed by the lithographic methods currently available.

The problem arises of using a transistor having a finned channel structure and the dimensions whereof are further reduced.

DESCRIPTION OF THE INVENTION

An aim of the present invention is that of providing a novel transistor with one or more fins of very reduced critical dimension, in particular less than 10 nanometres and preferably less than or equal to 3 nm, while having good electrical properties.

For this, the present invention relates, according to a first embodiment, to a method for producing a transistor wherein the channel structure includes one or more fin(s), the method comprising:

forming on a substrate one or more blocks referred to as "molding blocks", forming on said one or more molding blocks a layer based on a given semiconductor or semi-metallic material, this layer referred to as "thin layer" consisting of at most ten atomic or molecular monolayer(s) or laminae of two-dimensional crystal, at least partially removing said one or more molding blocks while retaining one or more portion(s) of the thin layer extending against at least one lateral face of said molding blocks, said one or more retained portions forming one or more fin(s) suitable for forming a channel structure of the transistor, producing a gate electrode against said one or more fin(s).

Thus, the fin(s) have a critical dimension which is not dependent on a lithographic method but which corresponds to the deposited thickness.

Preferably, the thin layer consists of one to five atomic or molecular monolayer(s) of two-dimensional crystal.

This thickness may be of the order of the size of an atom or a molecule when the two-dimensional crystal is advantageously in the form of a monolayer or a single lamina.

Advantageously, the given material of the thin layer is graphene or a metal chalcogenide, in particular $MoS_2$ or $WS_2$ or $WSe_2$ or $MoSe_2$. Such materials are suitable for producing fins with a very high surface-to-volume ratio while having very good electrical properties.

The gate formed on the fin(s) is preferably a surrounding gate, which may be distributed around a portion of the fin(s) on several different planes.

Typically, the thin layer is formed by catalytic growth, said one or more molding blocks being based on a catalytic material for the growth of said given material.

According to one option of use, the molding blocks may be made of a dielectric material, in particular $SiO_2$.

The method may comprise, prior to removing the molding blocks, the formation of one or more blocks referred to as "holding blocks" respectively situated at one or more ends of the molding blocks, said one or more holding blocks being suitable for ensuring mechanical strength of said one or more fin(s) during the removal of said one or more molding blocks.

Preferably, the source and drain electrodes of the transistor fulfil the holding block function.

In the case where said removal of the molding blocks is merely a partial removal, these blocks are preferably based on a dielectric material such that only the thin layer and corresponding fin structure carry out a conduction function.

In the optional case of partial removal of the molding blocks in a material which is not insulating, for example a semiconductor or conductive material, the dimensions of these molding blocks and the partial removal are then envisaged such that the molding blocks are not in contact at the ends thereof with each of the holding blocks. This prevents the molding blocks from being both in contact with the source block and with the drain block.

Advantageously, the source and drain electrodes are based on a conductive material whereas said one or more molding blocks are formed based on a material suitable for being etched selectively with respect to said conductive material.

According to one option of use of the method, in order to be able to etch the molding blocks without removing the whole thin layer, after forming the thin layer and prior to removing the molding blocks, the method may comprise steps of:

forming a masking covering the molding blocks, removing a thickness of the masking so as to reveal a top portion of the molding blocks.

According to a particular use of the method wherein the gate is a surrounding gate produced by forming a gate stack comprising at least one layer of gate dielectric and at least one layer of gate material, the method may further comprise localised removal of one or more zones of the surrounding gate so as to reveal one or more given regions of said one or more fins.

After the localised removal so as to remove zones of the gate stack, at least one capture layer based on a material suitable for absorbing and/or adsorbing at least one chemical species may be formed on the revealed given regions of said one or more fins.

According to a further aspect, the present invention relates to a method for manufacturing a chemical or biological sensor provided with at least one transistor implemented using a method as defined above.

According to a further aspect, the present invention relates to a transistor, in particularly finFET type comprising:

a channel structure provided with one or more fin(s) consisting of a semiconductor or semi-metallic material having one to ten atomic or molecular monolayer(s) of two-dimensional crystal, a surrounding gate electrode around said one or more fin(s).

The given material is typically a Van der Waals type material or a two-dimensional semiconductor.

The given material may in particular be graphene or a transition metal dichalcogenide.

Advantageously, the given material may be formed from a single monolayer (or lamina) of graphene or indeed from a single monolayer (or lamina) of transition metal dichalcogenide.

The transistor may thus be equipped with very thin fins, of the thickness of the other of the atom or of a molecule while retaining good electrical properties.

The transistor may be provided with source and drain electrodes disposed respectively at a first end and at a second end of the fins, the source and drain electrodes being based on a metallic material.

According to an embodiment of the transistor, it may be formed on a substrate and include at least a first fin and at least a second fin, the first and the second fin being parallel with a principal plane of the substrate and oriented in different directions, the first fin being in contact with the second fin.

For certain applications, the transistor may be provided with a portion of the fins covered by the surrounding gate and another by at least one capture layer suitable for absorbing and/or adsorbing at least one chemical or biological species.

Due to the size of the fins, the transistor is particularly suitable for detecting small quantities of chemical or biological elements.

Thus, according a further aspect, the present invention relates to a chemical or biological sensor provided with one or more fin transistors as defined above.

BRIEF DESCRIPTION OF THE FIGURES

The present invention will be understood more clearly on reading the description of embodiment examples given merely by way of indication and not limitation with reference to the appended drawings wherein.

The different parts represented in the figures are not necessarily represented according to a uniform scale, in order to render the figures more legible.

The different options (alternative embodiments and embodiments) should be understood as not being mutually exclusive and may be combined with one another.

Furthermore, in the description hereinafter, terms which are dependent on the orientation of the structure such as "vertical", "horizontal", "bottom", "lateral", apply considering the structure as oriented as illustrated in the figures.

DETAILED DESCRIPTION OF PARTICULAR EMBODIMENTS

An example of a method for producing a transistor, in particular of the finFET type, wherein the channel structure is formed from one or more fins of nanometric size and as used according to an embodiment of the present invention will not be described with reference to FIGS. 1A-1G (giving a transversal cross-sectional view) and FIGS. 2A-2F (wherein the structure being produced is represented as a perspective view).

A bulk semiconductor substrate, for example made of silicon, may be envisaged as the starting material. Alternatively, it is also possible to start from a semiconductor-on-insulator type substrate 1 formed from a semiconductor base layer, for example silicon, the base layer being covered with an insulating layer made of dielectric material, typically silicon oxide, in turn covered with a superficial semiconductor layer.

The substrate 1 may be provided with alignment marks, for example formed by etching parts not protected by a photosensitive resin mask or indeed by metal deposition followed by etching.

Figure 2A:
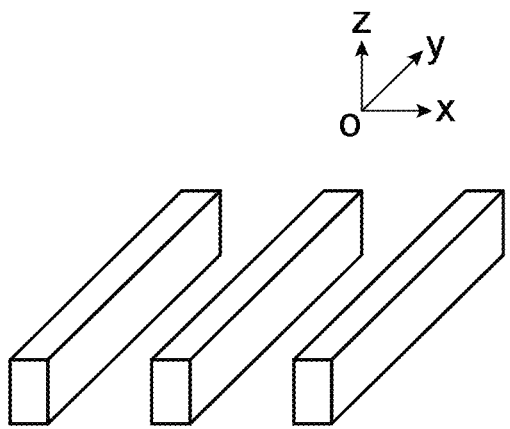

On the substrate 1, one or more blocks 3, referred to as molding blocks (FIG. 1A), are produced, which, in the particular example illustrated in FIG. 2A, are long blocks of parallelepipedal shape. In this example, several molding blocks 3 are disposed parallel with one another, according to a predetermined interval, which may be for example between 10 nm and 100 µm.

The blocks 3 have a critical dimension Dc1 typically between 30 nm and 100 µm. The critical dimension Dc1 may be less than 30 nm, this dimension generally corresponding to a limit dimension imposed by the lithographic methods currently available, in particular those using an electron beam (e-beam).

"Critical dimension" denotes the smallest dimension of a pattern measured parallel with the principal plane of the substrate 1. The "principal plane" is defined as a plane passing through the substrate 1 and which is parallel with the plane [O;x;y] of an orthogonal reference [O;x;y; z] given in the figures.

The molding blocks 3 may be formed for example by deposition of a layer based on a material 4 followed by photolithography and etching of this material 4 in order to define patterns.

Alternatively, to produce these blocks 3, openings are formed in a masking layer, in particular a photosensitive resin masking, then the masking openings are filled with a material 4. The masking is removed typically by means of a stripping method commonly referred to as "lift-off" when this masking is made of resin.

A thin layer 7 based on semiconductor material or semimetal is then formed, preferably of Van der Waals or two-dimensional (2D) type, from which it is envisaged to produce the channel structure of the transistor. The thin layer 7 of nanometric thickness is produced by growth on the molding blocks 3. "Nanometric" denotes a thickness of less than 10 nanometres.

Typically, the thin layer 7 has a thickness of less than 3 nm.

The thin layer 7 particularly consists of 1 to 10 atomic monolayer(s) of a crystalline two-dimensional material (2D) such as graphene or of 1 to 10 molecular monolayer(s) of a two-dimensional material (2D) of a material based on chalcogenides and transition metals.

"Atomic monolayer" denotes a lamina, otherwise referred to as a layer, wherein the thickness consists of a single atom. "Molecular monolayer" denotes a lamina, otherwise referred to as a layer, wherein the thickness consists of a single molecule, this layer being formed from a repeated pattern of molecules bonded together by means of covalent bonds.

Preferably, the thin layer includes at most 5 atomic or molecular monolayers of crystalline two-dimensional material, in particular of a two-dimensional semiconductor also referred to as 2D semiconductor.

Advantageously, the thin layer 7 deposited on the blocks 3 is an atomic monolayer or a molecular monolayer.

For example, the thin layer 7 may be formed from an atomic monolayer made of graphene, i.e. a two-dimensional lamina, composed of carbon atoms with a thickness of a single carbon atom.

According to a further example, the thin layer 7 may be formed from a molecular monolayer of transition metal dichalcogenides, i.e. a two-dimensional lamina of $MoS_2$ or $WS_2$ or $WSe_2$ or $MoSe_2$ molecules, forming a 2D crystal, with a thickness corresponding to a single molecule.

The growth of the thin layer 7 is carried out for example by CVD (Chemical Vapour Deposition). For example, when a graphene layer is formed, the growth may be carried out at a temperature between 900° C. and 1,200° C. Alternatively, the thin layer 7 may be formed by PVD (Physical Vapor Deposition).

Figure 1A:
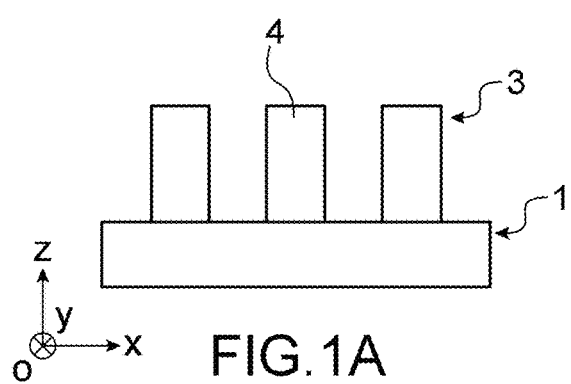
FIGS. 1A-1G and 2A-2F serve to illustrate an example of a method for producing a transistor with fins of very reduced dimensions and which may attain that of an atom or a molecule.
Figure 1B:
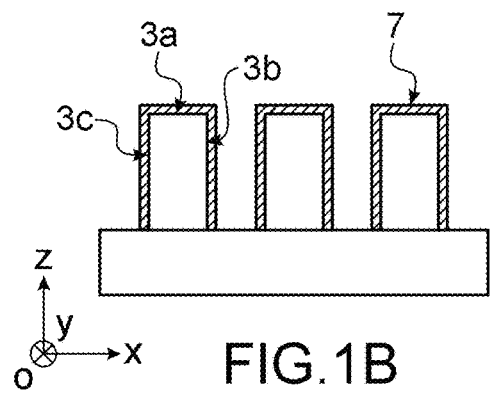
Figure 2B:
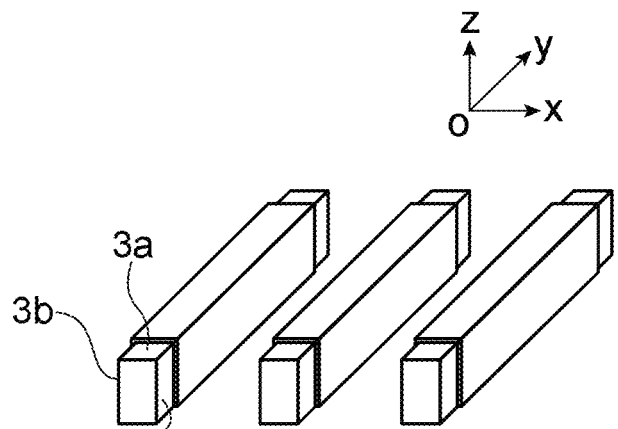

In the example illustrated in FIGS. 1B and 2B, the thin layer covers the molding blocks 3 and extends both on a top face 3a, and on lateral faces 3b, 3c of the blocks 3. According to an alternative embodiment (not shown), it is also possible to envisage producing the thin layer 7 only on a portion of the blocks 3, in particular on a lateral face of the blocks 3 by envisaging to mask further zones of these molding blocks 3.

Preferably, the molding blocks 3 are envisaged in a material 4 suitable for serving as a catalyst for the growth of the thin layer 7.

For example, in the case where it is sought to grow a thin layer 7 of graphene, copper or platinum blocks 3 may be envisaged. According to a further example, blocks 3 made of silicon oxide ($SiO_2$) or gold or indeed sapphire may be envisaged when it is sought to form a thin layer 7 of $MoS_2$ or $WS_2$. The material 4 of the blocks 3 may be $SiO_2$ when it is sought to grow a thin layer of $WSe_2$ or $MoSe_2$.

The choice of the material 4 of the blocks 3 may also be governed by that of the material based on which further elements referred to as "holding blocks" are envisaged and which are intended to support the thin layer 7 following a subsequent at least partial removal of the molding blocks 3.

Advantageously, the holding blocks 9, 10 correspond to the source and drain electrodes. Thus, a material 4 which can serve as a catalyst for the thin layer 7 and can be removed selectively in relation to that or those envisaged to form the source and drain electrodes is preferably chosen.

Figure 2C:
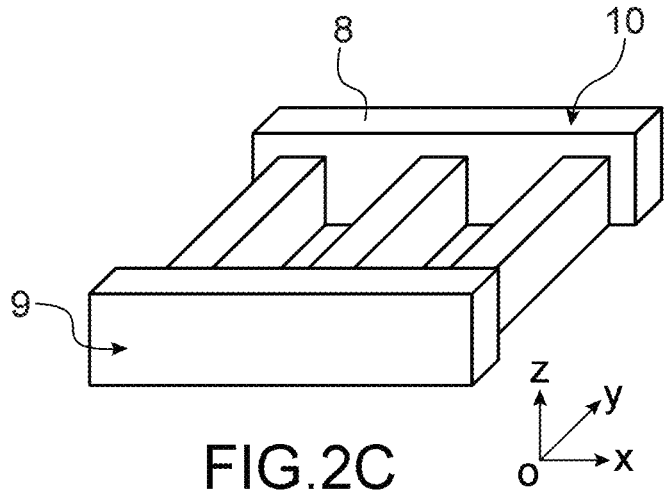

In the embodiment example illustrated in FIG. 2C, source 9 and drain blocks 10 are formed, serving as holding blocks at the ends of the molding blocks 3. The source and drain blocks 9, 10 join herein the ends of several molding blocks 3.

The source and drain blocks 9, 10 are based on a conductive material 8 which, as described above, is suitable for withstanding selective etching of the molding blocks 3. For example, in the case where the molding blocks 3 are based on copper, or sapphire or $SiO_2$, it may be envisaged to produce the blocks 9, 10 based on gold or palladium. According to a further example, molding blocks 3 based on platinum or gold may be formed whereas the blocks 9, 10 are based on titanium.

Figure 1C:
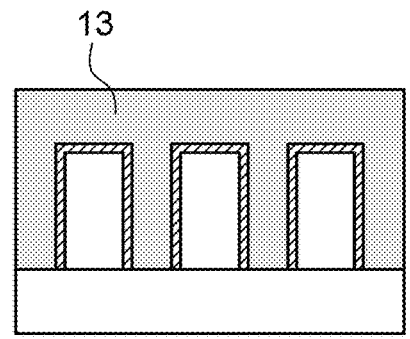
Figure 2D:
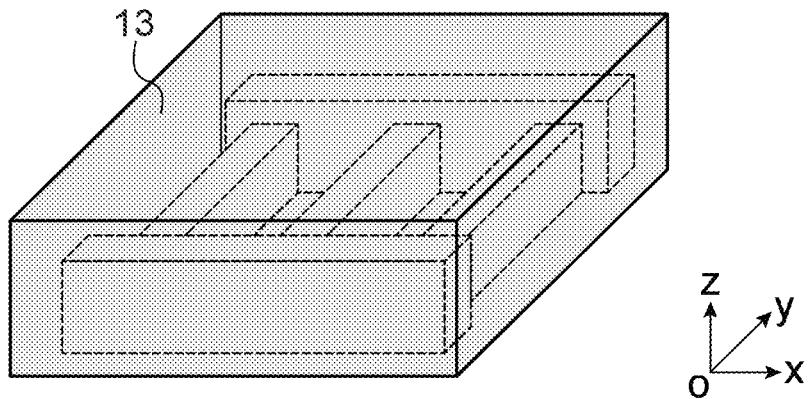

In FIGS. 1C and 2D, a subsequent step of forming a masking 13 is represented. The masking 13 is typically a resin masking and may be produced by spin coating. Typically, the masking is deposited so as to cover the molding blocks 3 as well as the source and drain blocks 9, 10.

A masking 13 thickness is then removed.

The partial removal of the masking 13 is carried out for example using plasma etching, in particular of the ICP (Inductively Coupled Plasma) or RIE (Reactive Ion Etching) type when the masking is a resin.

Figure 1D:
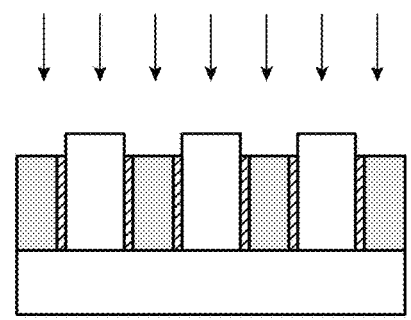
Figure 2E:
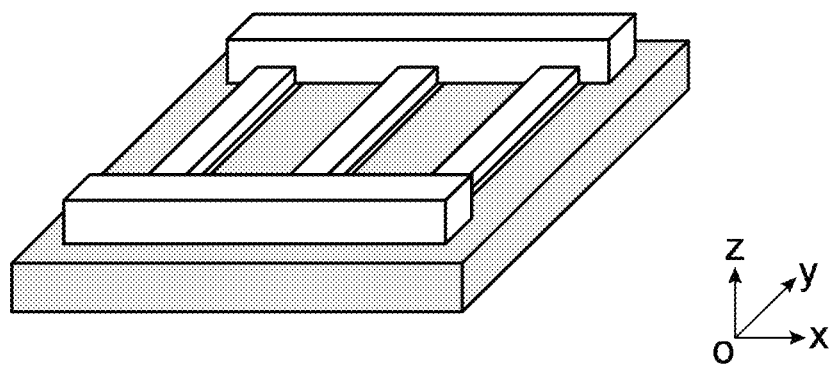

In the example illustrated in FIGS. 1D and 2E, this removal is carried out so as to remove once again a top portion of the molding blocks 3, the thin layer 7 being also removed at the level of this portion of the molding blocks 3. The material 4 forming the molding blocks 3 is thus revealed.

Figure 1E:
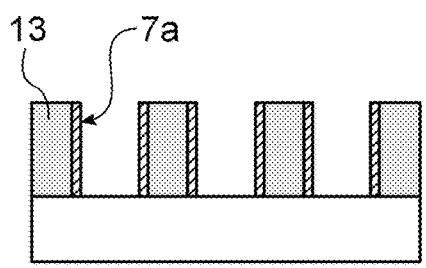

A removal of the mould blocks 3 is then performed as illustrated in FIG. 1E. The molding blocks 3 are in this embodiment example sacrificial blocks intended to be entirely removed. This removal is carried out by selective etching of the material 4 with respect to the material 8 of the holding blocks 9, 10, herein forming source and drain electrodes. The etching of the blocks 3 is typically carried out by dipping the structure in an etching solution.

Examples of etching solutions suitable for use are listed in a table given hereinafter, the solutions being associated respectively with different examples of catalyst materials 4, as well as materials 8 of the blocks 9, 10 suitable for withstanding selective etching of the molding blocks 3.

| Material of the thin layer 7 | Graphene | | $MoS_2$ | $WS_2$ | $WSe_2$ | $MoSe_2$ |
|---|---|---|---|---|---|---|
| Catalyst material 4 | Copper (Cu) | Platinum | $SiO_2$ | Gold | Sapphire | $SiO_2$ | $SiO_2$ |

-continued

| Etching solution of material 4 | Iron chloride | Ammonium persulfate $(NH_4)_2S_2O_8$ | Aqua regia | Hydrofluoric acid (HF) | Aqua regia | Phosphoric acid $(H_3PO_4)$ | Sodium hydroxide (NaOH) | HF | HF |
|---|---|---|---|---|---|---|---|---|---|
| Material of the source and drain blocks 9, 10 | Gold (Au) Platinum (Pt) | Gold Platinum | Titanium | Gold Palladium (Pd) | Titanium | Gold Palladium | Gold Palladium | Gold Palladium | Gold Palladium |

Thus, according to a particular embodiment example, when platinum molding blocks 3 are envisaged to grow a thin layer 7 of graphene, the etching solution used to remove the molding blocks 3 may be an aqua regia solution, in other words a mixture of hydrochloric acid and nitric acid. To be able to withstand such etching, it may in this case be envisaged to produce titanium blocks 8, 9.

On removing the molding blocks 3, the blocks 9, 10 situated at the ends thereof, make it possible to ensure mechanical strength of non-removed portions 7a of the thin layer 7.

Figure 2F:
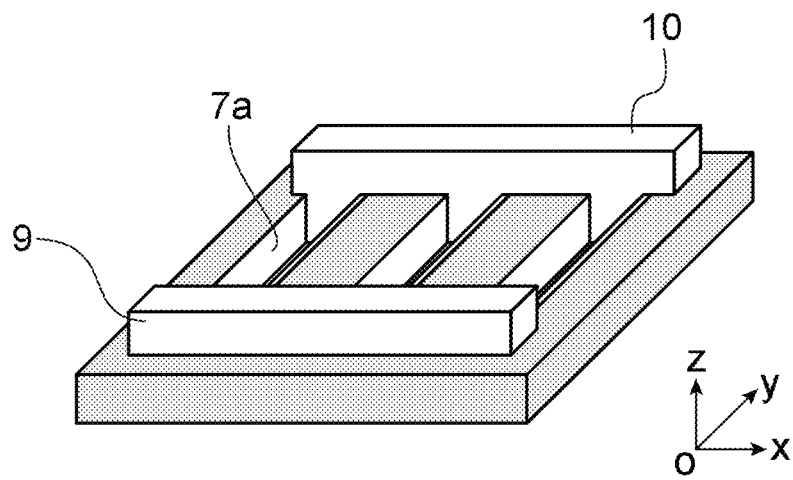

The embodiment example given in FIG. 2F shows the structure following the etching, with the blocks 9, 10 envisaged to form source and drain regions suitable for holding portions 7a of the thin layer 7 which extend vertically, in other words in a direction forming an angle different to zero, for example of the order of 90°, with the principal plane of the substrate 1.

The rest of the masking 13 may then be removed. For example, when the masking 13 is made of resin, the removal is typically performed by dipping in a solvent followed by drying.

Figure 1F:
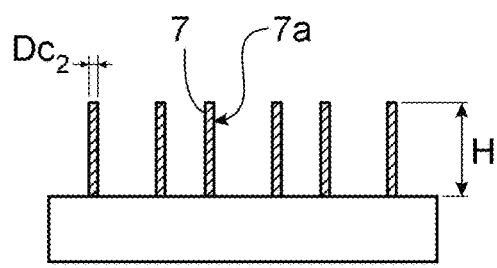

In FIG. 1F, the structure is represented following the removal of the masking 13. The remaining vertical portions 7a of the thin layer 7 form fins envisaged to produce a channel structure for the transistor. The critical dimension Dc2 of the fins 7a corresponds to the thickness of the thin layer 7.

Due to the holding of the fins 7a by the blocks 8, 9, fins 7a of extremely small critical dimension may advantageously be envisaged. Thus, when a thin layer 7 is deposited in the form of an atomic (or molecular) monolayer, a critical dimension Dc2 may thus be obtained of the order of the size of an atom (respectively of a molecule). Fins having a high aspect ratio Dc2/H in other words of the critical dimension Dc2 over the height H (dimension measured parallel with the z axis) while retaining good mechanism strength may also be envisaged. The distribution interval of the fins 7a is dependent on that initially envisaged for the molding blocks 3 and on the critical dimension Dc1 thereof.

Figure 1G:
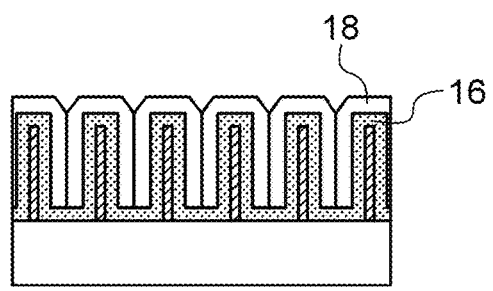

A surrounding gate is then produced on the fins 7a. For this, a layer of dielectric material 16 such as for example silicon oxide or $HfO_2$ is first deposited. The fins 7a are then covered with a gate material 18 such as for example a metal such as gold (FIG. 1G).

For certain applications, in particular for the use of a sensor, it may be required to remove certain portions of the gate stack at the level of given regions of the fins and thus reveal regions of the channel structure.

Steps (not shown) of producing contacts and connections may then be envisaged.

Figures 3A, 3B:
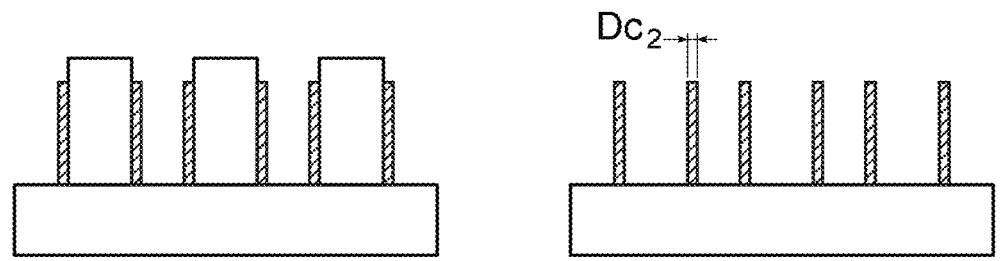
FIGS. 3A-3B serve to illustrate an alternative embodiment of a method for producing the fin transistor.

According to an alternative embodiment of the example of the method described above, after revealing the top portion of the molding blocks 3, the removal of the resin masking 13 may be carried out (FIG. 3A). The masking 13 is thus removed before removing the molding blocks 3 (FIG. 3B).

In one or the other of the embodiment examples described above, the molding blocks 3 form a mould wherein the thin layer 7 substantially reproduces the relief. It is thus possible to produce fins of different shape to that described above particularly by adapting the shape of the molding blocks 3 which is not necessarily parallelepipedal.

In one or the other of the embodiment examples described above, the molding blocks 3 are entirely removed. A partial removal of the molding blocks may alternatively be envisaged. Preferably, when a portion of the molding blocks is retained, these blocks are envisaged in a dielectric material so as particularly to prioritise conduction via the fin structure.

In one or the other of the examples described above, the holding blocks 9, 10 have advantageously the further function of forming source and drain electrodes. It is also possible to envisage producing these electrodes after forming holding blocks 9, 10.

A transistor as described above may find applications in various types of circuits for example in integrated circuits, processors, logic circuits.

Figure 4:
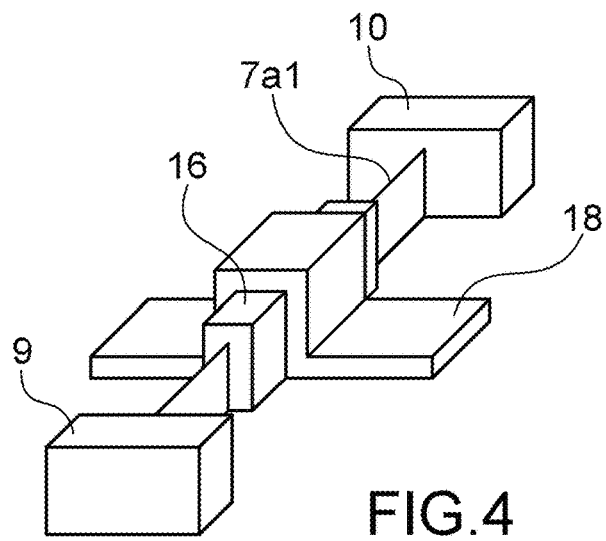
FIG. 4 illustrates an example of a finFET transistor with fin of very reduced dimension and as used according to an embodiment of the present invention.
Figure 5:
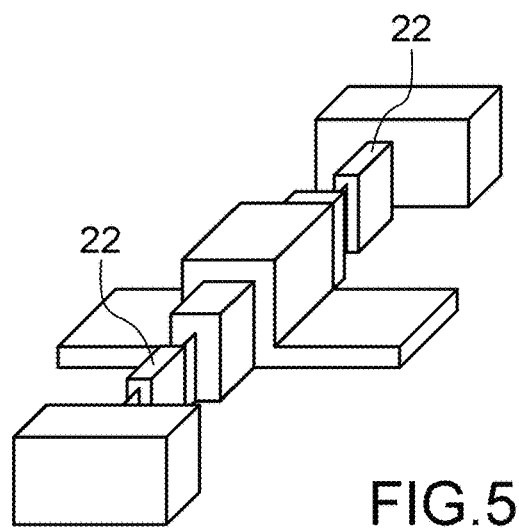
FIG. 5 illustrates an example of fin transistor as used according to an embodiment of the present invention and further provided with a capture layer for detecting gas or biological elements.

An example of finFET transistor produced using a method of the type of that described above is illustrated in FIG. 4. The gate stack 16, 18 is only retained on a central portion of a fin 7a, whereas end regions 7a1 situated between the central portion and the source and drain blocks 9, 10 are revealed.

Such a structure may serve as a base for example for the embodiment of a detection structure for a chemical and/or biological sensor of enhanced detection sensitivity and of reduced size.

The revealed regions 7a1 of the fin 7a may thus serve to accommodate at least one capture layer 22, also referred to as "functionalisation layer" and which is based on a material suitable for absorbing and/or adsorbing and/or reacting with at least one chemical or biological species to be detected.

Chemical or biological elements to be detected are suitable for being absorbed or adsorbed or reacting with the capture layer 22, inducing a modification of the electrical properties of the channel structure.

The detection sensitivity is especially enhanced as the fin 7a is thin.

A fin based on a 2D crystal such as MoS2 or graphene has a very high surface-to-volume ratio while having very good electrical performances which renders the transistor provided with such a structure particularly advantageous for the use of high-sensitivity sensors.

Various types of capture layers and the associated applications thereof are listed in the table hereinafter by way of example.

| APPLICATIONS | CAPTURE LAYER 22 | PHYSICAL CAPTURE PRINCIPLE |
|---|---|---|
| Gas detection | Porous materials (Porous alumina, Porous silicon, nanoporous amorphous carbon) | Adsorption, Physisorption, Chemisorption |

| APPLICATIONS | CAPTURE LAYER 22 | PHYSICAL CAPTURE PRINCIPLE |
|---|---|---|
| Non-biological molecule detection in liquid medium | Metal oxides ($Cr_2O_3$, $Mn_2O_3$, $Co_3O_4$, NiO, CuO, SrO, $In_2O_3$, $WO_3$, $TiO_2$, $V_2O_3$, $Fe_2O_3$) Capture layers similar to those of gas detectors may be applied | Chemical reaction (reduction oxidation of capture layer atoms) |
| | Molecular fingerprint polymers (Composed of a functional monomer polymerised around the molecule to be detected, the monomers suitable for being used for example: Methyl methacrylate,N,N'-methylenediacrylamide,3,5-bis(acryloylamido)benzoic acid | Physical conformation recognition |
| Biological molecule detection | Antibodies (IgG, IgM, IgE) | Specific biological recognition |
| | DNA (complementary strands of a DNA target to be detected) | Strand hybridisation |
| | Enzyme (Lactase, Amylase, etc.) | Specific biological recognition |

According to a particular embodiment example wherein the sensor is a gas sensor, a capture layer 22 made of porous material such as porous alumina or porous silicon may be envisaged. According to a further particular embodiment example wherein the sensor is dedicated to non-biological molecule detection, a capture layer 22 made of polymer such as Methyl methacrylate may be envisaged.

Given the dimensions of the fin(s) 7a forming the channel structure and the embodiment whereof is described above, such a transistor is particularly suitable for detecting very small quantities of biological and/or chemical elements, in particular compounds present at a concentration corresponding to several ppb or to several hundred ppb (parts per billion).

Figure 6:
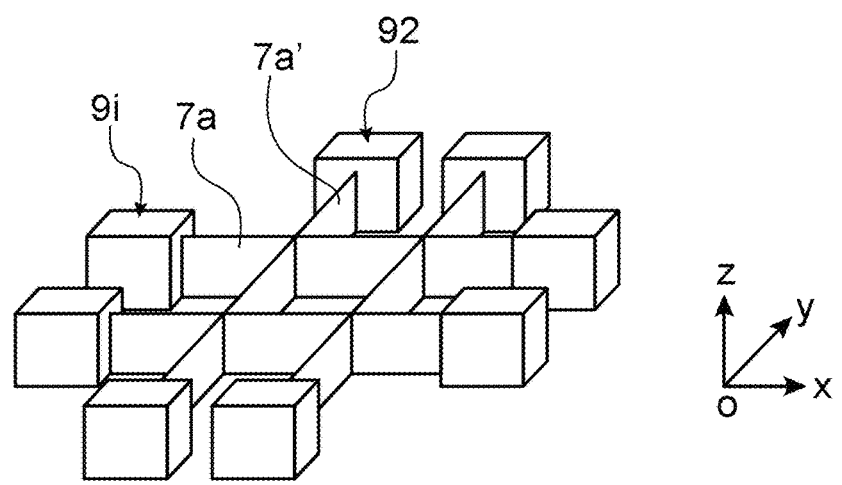
FIG. 6 illustrates a particular example of a transistor with orthogonal fins in relation to one another and joining together in at least one contact point.

A method as described above wherein the critical dimension of the fin is dependent on the thickness of a thin layer of two-dimensional material and the arrangement whereof is dependent on the shape and the arrangement of at least one molding block whereon this fin is formed, may be suitable to produce a structure of the type of that illustrated in FIG. 6.

This structure includes several fins 7a, 7'a oriented in different directions not parallel with one another. In the particular example of FIG. 6, the structure includes fins 7a, 7'a disposed perpendicularly to the substrate (plans parallel with the plane [O;x;y], the substrate not being represented) and orthogonal with one another. The fins 7a, 7'a join at a meeting or intersection point. The fins 7a, 7'a are connected to and secured mechanically respectively by electrodes 91, 92.

The invention claimed is:

1. A method for producing a transistor wherein a channel structure includes one or more fin(s), the method comprising the steps of:
   forming on a substrate one or more blocks referred to as moulding blocks,
   forming on said one or more moulding blocks a thin layer based on a given semiconductor or semi-metallic material, and consisting of one to ten atomic or molecular monolayer(s) of two-dimensional crystal, then,
   forming one or more holding blocks respectively at one or more ends of the moulding blocks, then
   forming a masking covering the moulding blocks and the holding blocks,
   partially removing the masking, a thickness of the masking being removed so as to reveal a top portion of the moulding blocks and the holding blocks, and removing said thin layer at the level of the top portion of the moulding blocks,
   removing said one or more moulding blocks while retaining one or more portion(s) of the thin layer extending against at least one lateral face of said moulding blocks, said one or more retained portions forming one or more fin(s) for forming a channel structure of the transistor, the removal of said moulding blocks being carried out by selective etching with respect to the material of said one or more holding blocks, said one or more holding blocks being for ensuring mechanical strength of said one or more fin(s) during the removal of said one or more moulding blocks, then
   removing the rest of the masking, then
   producing a gate electrode against said one or more fin(s).

2. The method according to claim 1, wherein the thin layer is formed by catalytic growth, said one or more moulding blocks being based on a catalytic material for the growth of said given material.

3. The method according to claim 1, wherein the holding blocks are source and drain electrodes.

4. The method according to claim 3, wherein the source and drain electrodes are based on a conductive material.

5. The method according to claim 1, wherein said one or more moulding blocks are made of a dielectric material.

6. The method according to claim 5, wherein said dielectric material is $SiO_2$.

7. The method according to claim 5, wherein the given material of the thin layer is $MoS_2$, $WS_2$, $WSe_2$, or $MoSe_2$.

8. The method according to claim 1, wherein the given material of the thin layer is graphene or a metal chalcogenide.

9. The method according to claim 1, wherein the gate is a surrounding gate produced by forming a gate stack comprising at least one layer of gate dielectric layer and at least one layer of gate material, the method further comprising localised removal of one or more zones of the surrounding gate so as to reveal one or more given regions of said one or more fins.

10. The method according to claim 9, wherein after the localised removal so as to remove zones of the gate stack, at least one capture layer based on a material suitable for absorbing and/or adsorbing at least one chemical species may be formed on the revealed given regions of said one or more fins.

11. The method according to claim 1, wherein said partial removal of a thickness of the masking and of said thin layer at the level of said top portion of the moulding blocks is performed using plasma etching.

12. The method according to claim 1, wherein the gate is a surrounding gate.

13. A method for fabricating a chemical or biological sensor provided with at least one transistor comprising the production of the transistor according to the method according to claim 1.

* * * * *